United States Patent [19]

Richardson et al.

[11] 4,016,721
[45] Apr. 12, 1977

[54] POSITIONING DEVICE USING NEGATIVE SPRING-RATE TENSIONING MEANS

[75] Inventors: David A. Richardson, Sheldonville; Robert J. Robinson, Lexington, both of Mass.

[73] Assignee: The Foxboro Company, Foxboro, Mass.

[22] Filed: Sept. 15, 1975

[21] Appl. No.: 613,229

Related U.S. Application Data

[60] Division of Ser. No. 444,824, Feb. 22, 1974, Pat. No. 3,940,935, which is a continuation of Ser. No. 239,906, March 31, 1972, abandoned.

[52] U.S. Cl. .................................................. 60/528
[51] Int. Cl.² .......................................... F03G 7/06
[58] Field of Search ..................... 60/527, 528, 529; 337/123, 140, 105, 106, 107; 317/132; 335/141; 73/362.4, 363, 362.7; 200/3, 56 R, 56 A; 236/101

[56] References Cited

UNITED STATES PATENTS 2,787,118  4/1957  Markham ............................. 60/528
3,625,002  12/1971  Davis ................................... 60/528
3,691,499  9/1972  Tyler ................................... 60/528

*Primary Examiner*—Allen M. Ostrager
*Attorney, Agent, or Firm*—Parmelee, Johnson & Bollinger

[57] ABSTRACT

A positioning device for controlling a member such as a pen of a chart recorder, wherein the positioning motion is produced by a wire formed of temperature-responsive material (Nitinol) exhibiting a martensitic transformation which contracts the wire when its temperature is increased within a predetermined temperature range, and relaxes the wire when cooled within that range. The wire is maintained under tension by a spring having a negative spring-rate. This spring cooperates with internally generated forces and the elasticity of the wire material to produce contraction/expansion length changes of the wire in response to changes in its temperature. Electrical circuitry for controlling the wire temperature is disclosed, and includes means for inductively developing a frequency-modulated pulse-current through the wire.

5 Claims, 11 Drawing Figures

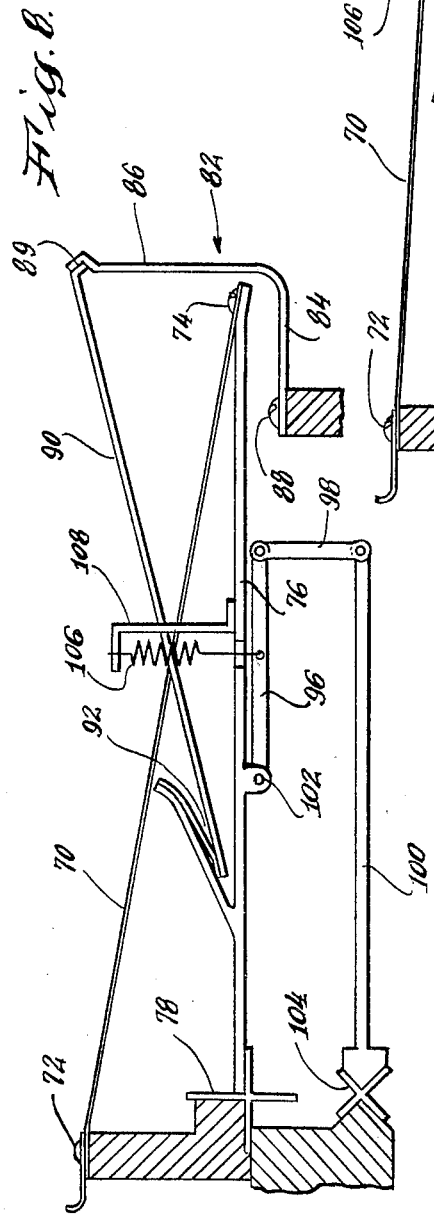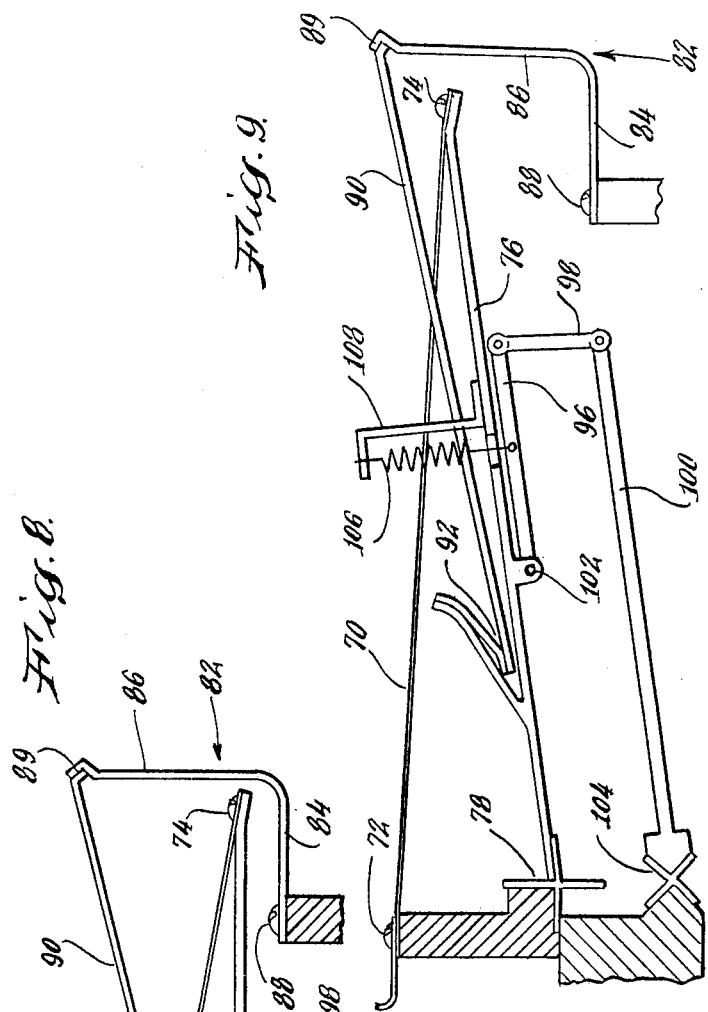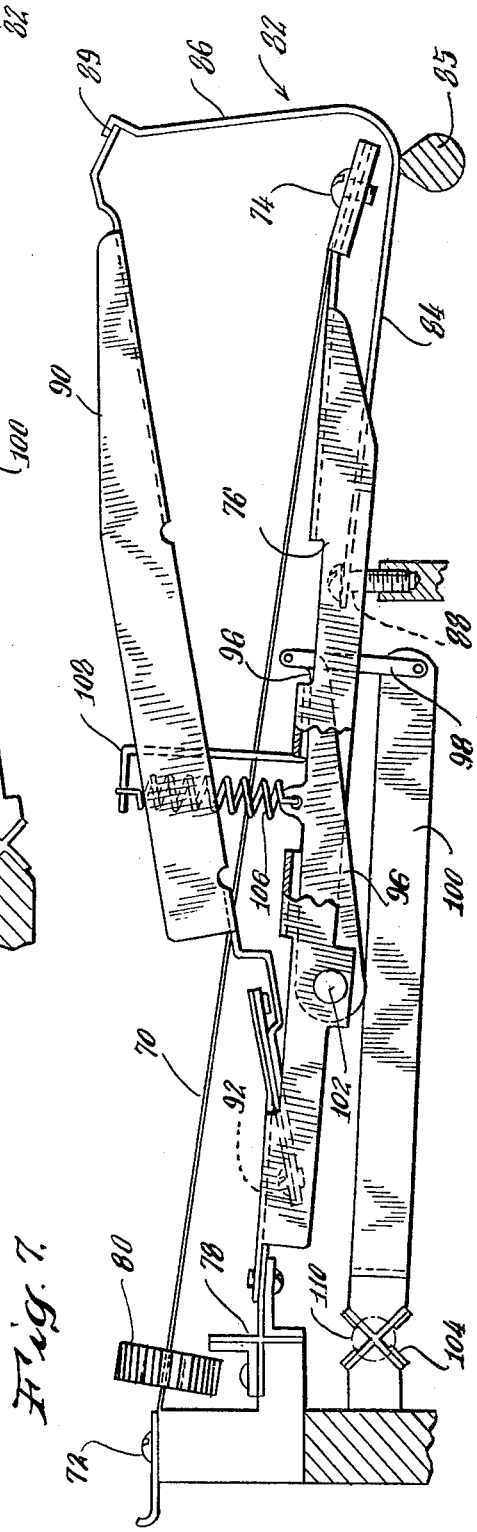

POSITIONING DEVICE USING NEGATIVE SPRING-RATE TENSIONING MEANS

This is a division of application Ser. No. 444,824 filed on Feb. 22, 1974 now U.S. Pat. No. 3,940,935 which in turn is a continuation of Ser. No. 239,906 filed Mar. 31, 1972, now abandoned.

BACKGROUND OF THE INVENTION

1. Field of the Invention

This invention relates to motion-producing devices within the broad category of prime movers. More particularly, this invention relates to positioning devices utilizing an elongate element the temperature of which is controlled to cause the element to contract and expand so as to develop an output motion.

2. Description of the Prior Art

Copending application Ser. No. 2,120, now abandoned, filed by E. O. Olsen on Jan. 12, 1970, discloses several positioning devices of a type to which the present invention is directed. In such devices, the motion-producing element is a wire illustratively made of Nitinol (a compound of Nickel and Titanium). Such material undergoes a temperature-responsive martensitic transformation which causes an internally generated contraction when the temperature is raised through the operating range. The wire is maintained continuously under tension developed by an external spring, and when the wire is cooled down through the operating temperature range, the spring force elongates the wire back to its original length. A feedback system, responsive to the position of the output member, automatically adjusts the heat input to the wire to maintain the output position in correspondence to an input signal. Such devices can be used for many purposes, such as positioning the pen of a chart recorder, actuating a valve, etc.

SUMMARY OF THE INVENTION

A principal object of the invention is to provide more effective operation of a positioning device of the type having a temperature-responsive element arranged to produce contraction/elongation movement. A more specific object is to provide novel apparatus and techniques which enhance the efficiency and reliability of such positioning devices.

In an embodiment of the invention to be described below in detail, the positioning device comprises a Nitinol wire coupled to an electrical circuit which produces a flow of current through the wire, thereby controlling the wire temperature. One end of the wire is fixedly secured to the chassis of the device, and the other end develops the output motion as the wire contracts and expands. The wire at all times is maintained under tension by a spring having a negative spring rate. Thus, as the wire contracts with an increase in temperature, the spring resists that movement with an opposing force which is reduced in proportion to the amount of movement.

Since the resisting spring force diminishes as the wire contracts, the amount of internally-generated contracting force required to overcome the spring force is correspondingly reduced. This reduces the volume of Nitinol required to perform a given amount of work, in comparison with a similar device using a positive spring-rate spring. The reduction in spring force also permits (1) an increase in the response speed of the wire, (2) a reduction in the required operating temperature range, and (3) a reduction in the operating stress range, in amounts depending upon design trade-off considerations.

Other detailed objects, aspects and advantages of the invention are pointed out in, or apparent from, the following description considered together with the accompanying drawings.

DETAILED DESCRIPTION OF THE DRAWINGS

FIG. 7 is a plan view of a pen motor in accordance with the present invention;

FIGS. 8 and 9 are simplified schematic versions of the pen motor of FIG. 7, shown in two different positions;

DESCRIPTION OF PREFERRED EMBODIMENTS

Figure 1:
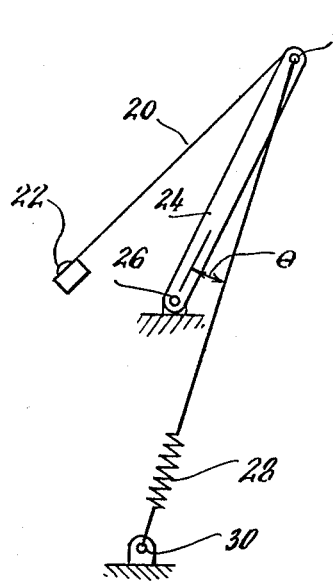
FIGS. 1–3 are schematic illustrations of a positioning device in accordance with the present invention, shown in different positions.
Figure 2:
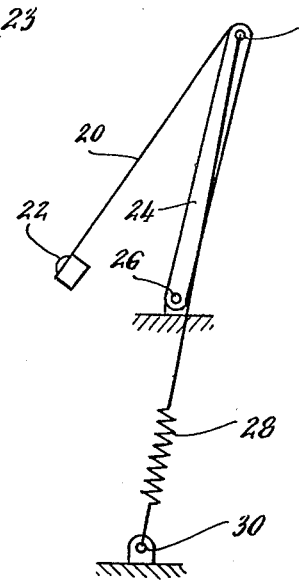
Figure 3:
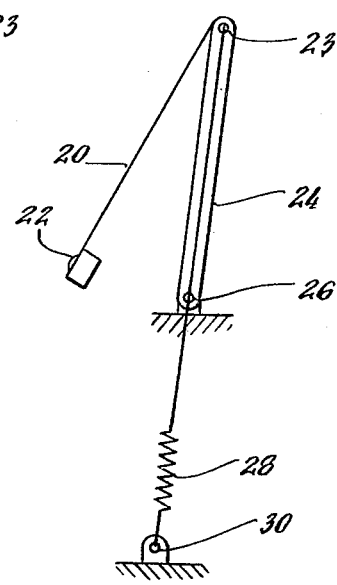

Referring now to FIGS. 1–3, there is shown in schematic outline a positioning device including a Nitinol wire 20 one end of which is secured to a fixed point 22, and the other end of which is fastened to the movable end 23 of a pivoted lever 24. Means (not shown) are provided to control the temperature of the wire over an operating range wherein the wire contracts as the temperature is raised and relaxes as the temperature is lowered. The wire temperature may for example be controlled by causing electrical current to flow through the wire, as described in the above-mentioned copending application Ser. No. 2,120.

As the wire 20 contracts (progressing from FIG. 1 to FIG. 2), it rotates the lever 24 counterclockwise about its pivot axis 26. This output motion is resisted by a spring arrangement comprising a coiled tension spring 28 connected between the upper end 23 of lever 24 and a fixed "ground" or base point 30 below the level of the pivot axis 26. The spring force, which in total is essentially constant over the range of motion illustrated, can be considered as composed of two components, one directed along the lever 24 towards the pivot axis 26 (and hence not an influence on the pivotal movement), and another component directed at right angles with respect to the longitudinal direction of the lever, and thus tending to oppose the counterclockwise motion of the lever produced by contraction of the wire.

The magnitude of the right-angled component of spring force is proportional to the sine of the angle $\theta$ between the lever and the spring line. Thus, as the wire contraction proceeds, and the angle $\theta$ decreases correspondingly, the component of spring force similarly decreases. Accordingly, the spring acts with a negative spring rate, such that the resisting spring force diminishes with increases in wire contraction. If the contraction were allowed to proceed to the extent shown in FIG. 3, the three points 23, 26 and 30 will come into alignment, and the component of spring force resisting the wire contraction will drop to zero.

Since the wire-tensioning spring force must be overcome by the internally-generated temperature-responsive forces produced within the Nitinol material, the reduction in spring force, through use of a negative spring rate, correspondingly reduces the amount of Nitinol force required to achieve a given amount of output motion. This in turn leads to the possibility of reducing the volume of Nitinol required for the same amount of work performed. Seen from another point of view, the improvement in overall operational efficiency can be taken advantage of by gaining an increase in response speed of the positioning device. Similarly, it becomes possible to reduce the operational range of temperatures and/or stresses to which the wire is subjected, thereby enhancing the reliability of performance of the apparatus. This is particularly important for apparatus which must operate over many thousands or even millions of cycles.

Figure 4:
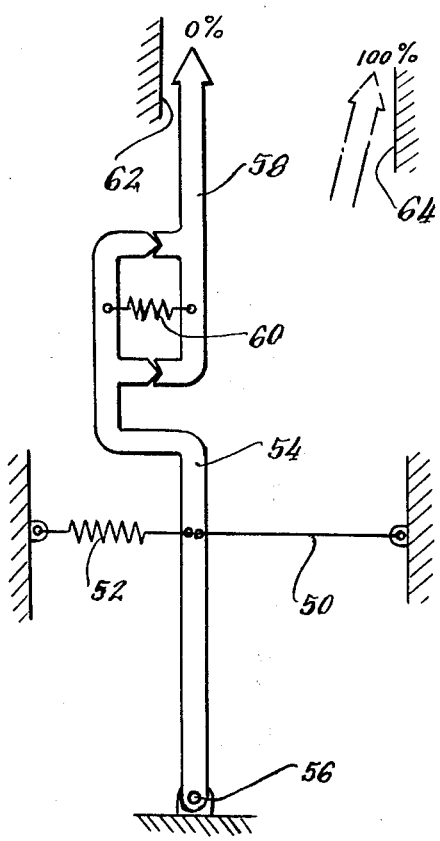
FIG. 4 is a simplified schematic representation of a positioning device with means to limit externally applied wire stress.

In most practical applications of a positioning device, the output motion will be limited by stops external to the device. It is desired that wire stress be kept to low values when the external stops are encountered. FIG. 4 illustrates such stress limiting means for a contraction-/expansion wire motor comprising a Nitinol wire 50 held taut by a spring 52. A motion member 54 is pivoted at 56 for rotational movement between points labelled 0% and 100%. The motion member is articulated to an output member in the form of a pointer 58 which during normal operation is held in position with respect to member 54 by an overtravel spring 60. If the pointer encounters stops 62 or 64, or if the pointer is moved by hand, it will rotate (clockwise or counterclockwise) about one or the other points of contact with member 54. The stress change in the wire will be limited to a fraction of the preset force of coupling spring 60.

Figure 5:
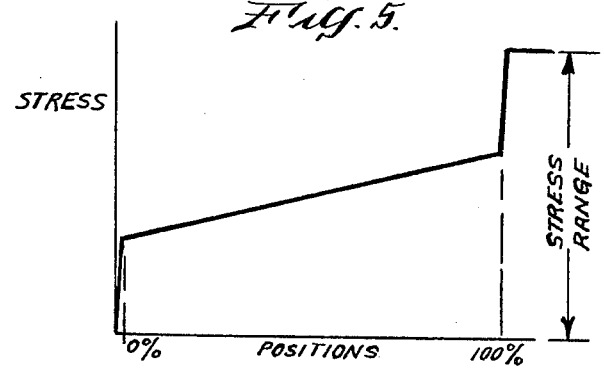
FIG. 5 is a graph showing how the wire stress varies in the FIG. 4 device using a positive spring-rate tension.

If the tensioning spring 52 has a positive-spring rate, the stress within the wire 50 will vary as shown in FIG. 5, as the output member moves from one stop to the other. During the principal motion from 0 to 100% of full scale, the stress increases linearly as the spring 52 expands under the contractive pull of the wire. At the left-hand end of the graph, the stress drops off rapidly beyond the 0% position, due to the opposing force developed by limit stop 62 acting through coupling spring 60. At the right-hand end, the stress increases rapidly beyond 100% of scale, due to the force of limit stop 62 which, through spring 60, augments the force of spring 52. Thus, the total stress range to which the wire 50 is subjected represents an effective summation of the spring stresses.

Figure 6:
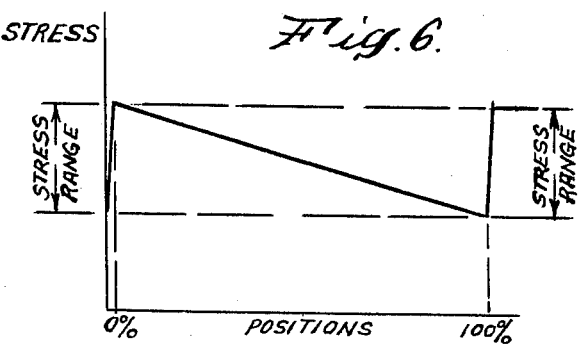
FIG. 6 is a graph like FIG. 5, but showing the stress variation using a negative spring-rate tension.

By using a negative spring-rate spring 52, the total working stress range of the wire 50 can be substantially reduced, as indicated in FIG. 6. The stress range may for example be one-third of that required by a positive spring-rate spring.

FIG. 7 shows in detail one embodiment of a positioning device utilizing a negative spring-rate spring for tensioning a temperature-responsive wire element 70. FIGS. 8 and 9 illustrate the same positioning device in somewhat schematic form to emphasize certain operational features, and show the device in two different output positions to clarify the movements of various interconnecting components.

The Nitinol wire 70 is fixed at its left-hand end to a point 72 on the metal chassis or frame of the device. The right-hand end of the wire is connected to the free end 74 of a lever 76 which serves as motion member, and is pivotally mounted to the frame by cross-flexures 78. Electrical current is induced into the wire by a coupling coil 80 (FIG. 7) on a toroidal core. The wire 70 passes through the center of this toroid and, in combination with the metal frame, presents a one-turn loop inductively coupled to the toroid coil in transformer fashion. Alternating current of controllable energy content is generated within the toroid, producing a corresponding flow of current within the wire to heat it to an appropriate, adjustable level within the range of operating temperatures.

As the wire 70 is heated, it contracts, thereby rotating lever 76 counterclockwise about its pivot 78. This rotation is resisted by a spring mechanism which includes a curved leaf spring generally indicated at 82, and comprising two sections 84, 86 extending transversely to each other. The spring portion joining these two sections is held in position by a back-up support or bumper 85.

The first spring section 84 is fixedly secured to the frame at point 88, and the end of the other section 86 engages the free end point 89 of a force-strut 90 to apply compressive spring force longitudinally down the strut. The strut delivers the spring force to the lever 76 through a flexure strip at a connection point 92. This flexure connection permits rotational movement of the lever while maintaining the strut in force-applying relation thereto.

The compressive spring force is applied by the strut 90 at a small angle with respect to the lever 76. This spring force includes a component opposing counterclockwise rotation of the lever 76 caused by contraction of the wire 70. The magnitude of this opposing component of force is proportional to the small angle between the strut and the lever, and thus the opposing spring force decreases with the amount of counterclockwise rotation, e.g., as the lever moves from the FIG. 8 position to the FIG. 9 position. Accordingly, the spring 82 develops an effective negative spring rate with respect to the lever 76.

A significant feature of the FIG. 7 spring arrangement is its overall compactness. This is achieved by employing a leaf spring the sections of which are located close to the principal operating components of the pen motor. That is, one section 84 extends alongside of lever 76, and the other section 86 extends transversely thereto over to the spring "base" point 89 where the spring force is applied to the strut 90. It will be apparent that if the lever 76 were rotated counterclockwise to such an extent that the base point 89 is aligned with the spring force application point 92 and the lever pivot point 78, the spring force point 92 would be located between the pivot point and the base point.

The motion of lever 76 is coupled to an output linkage comprising links 96, 98 and 100. Link 96 is pivotally mounted on lever 76 at point 102, and link 100 is pivotably mounted to the frame by cross-flexures 104. Motion of the lever 76 is transmitted to the output linkage through a light spring 106 connected between link 96 and a transverse arm 108 integral with lever 76.

The recorder pen (not shown) may be attached to the output linkage in any conventional fashion, as by means of a stud 110 aligned with the cross-flexures 104 and integral with link 100. Thus, any motion of the output linkage results in a corresponding pivotal motion of the pen. If, through some inadvertence, the pen is shifted about its pivot axis by an external force (i.e., an operator error), the output linkage will move with the pen, and the spring 106 will absorb this motion so as to prevent transmission of damaging stress to the wire 70.

Figure 10:
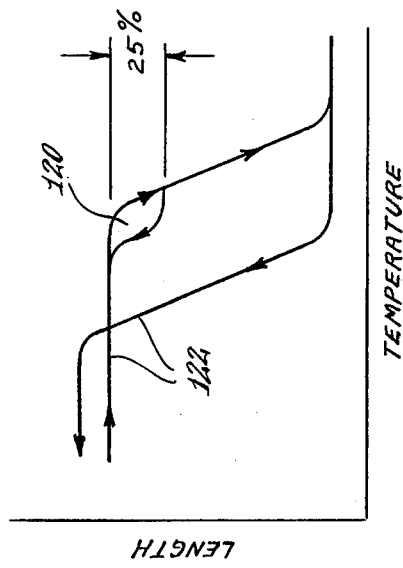
FIG. 10 is a graph showing relationships between wire elongation and temperature.

The overall mechanism is so arranged that full-scale output motion of the pen is achieved with a contraction/expansion of the wire 70 of only about 25% of its maximum attainable contraction/expansion. As shown in FIG. 10, this limitation on the required change-in-length of the wire provides consistent results with successive cycles. That is, there is no net change in length of the wire when operating on the minor hysteresis loop 120. If the maximum length-change were utilized, there would be creep (permanent elongation) of the wire, as indicated on the major hysteresis loop 122.

Figure 11:
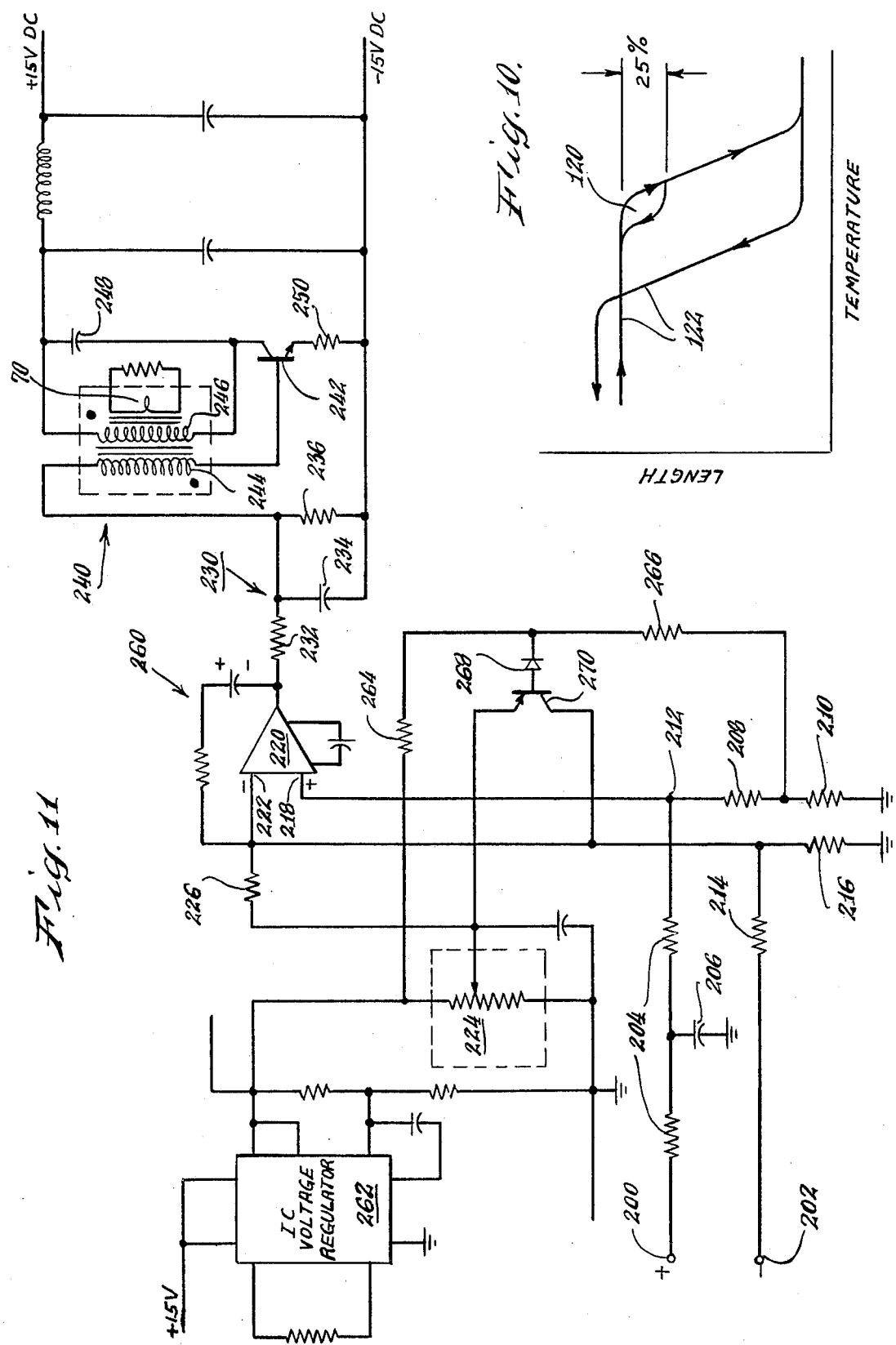
FIG. 11 is a circuit diagram of the electrical system for controlling the current in the wire.

Referring now to FIG. 11, which shows electronic circuitry associated with the device of FIG. 7, an input command signal (0–10 volts full-scale) is applied to input terminals 200, 202 leading to an RC filter comprising series resistors 204 (232K each) and a shunt capacitor 206. The resistors 204 also serve, together with resistors 208, 210 (178K; 274 ohms), as a voltage-divider, to develop at input point 212 a signal approximately one-third the magnitude of the original signal.

Input terminal 202 is connected through resistors 214, 216 (464K each) to ground. However, in practice terminal 202 will be essentially at ground potential and thus resistors 214, 216 do not have any significant effect on the magnitude of the applied signal.

The signal at circuit point 212 is applied to one input terminal 218 of an operational amplifier 220. The signal on the other input terminal 222 is a position feedback signal derived from a pen-position potentiometer 224. This potentiometer is a 10K linear slide-wire the wiper of which is physically driven by lever 76 (FIG. 7), and is electrically connected to amplifier 220 through a voltage-divider consisting of resistor 226 (287K) and resistors 214 and 216. The slide-wire may be physically located beneath the lever 76, but is not shown in FIG. 7.

When the pen is not positioned in conformity with the command signal, there will be a net input signal at amplifier 220 which produces a corresponding amplifier output current. This output current is directed to an RC circuit 230 including a resistor 232 (12.1K) and a capacitor 234 (0.012 microfarads) in parallel with another resistor 236 (3.48K). The magnitude of amplifier current determines the pulse-repetition-rate of a relaxation oscillator 240 coupled to the RC circuit 230, and thereby determines the electrical current flowing through the Nitinol wire 70. (As previously explained, the wire is transformer-coupled to the oscillator.)

The oscillator 240 includes a transistor 242 the base of which is connected through one transformer winding 244 (two turns) to capacitor 234. The collector is connected through a second transformer winding 246 (12 turns) in parallel with a capacitor 248 (1000 pF), to the positive power supply terminal. The emitter is connected through a small resistor 250 (16.2 ohms) to the negative power supply terminal.

Current from amplifier 220 charges capacitor 234 and thereby correspondingly raises the base potential of transistor 242 until current flow is initiated through the transistor. The resulting change in current in winding 246 induces in winding 244 a voltage augmenting the voltage from capacitor 234, thereby rapidly switching the transistor on. Accordingly, a relatively large pulse of current flows through winding 246, and induces a corresponding flow of current through the one-turn transformer winding represented by the wire 70 and the return path through the metal motor frame.

This voltage induced in winding 244 is polarized in a direction which tends to cause a reverse flow of current into capacitor 234, i.e., opposing the current from amplifier 220. Thus, after a predetermined time period, the base of transistor 242 will be lowered to a point driving the transistor out of conduction, and ending the current pulse in the wire 70. Thereafter, the cycle repeats, as the capacitor 234 again begins to recharge from the amplifier 220.

The rate at which capacitor 234 charges up is proportional to the current flow from amplifier 220, and this in turn determines the time duration between oscillator pulses. Consequently, the duty cycle of the output pulses (corresponding to the RMS signal level in the wire 70) is determined by the deviation between the actual pen position and the commanded position.

The gain of amplifier 220 is quite high, such that small deviations of pen position will cause the amplifier output to saturate in one direction or the other. The amplifier includes a negative feedback circuit 260 which provides dynamic compensation for the servo loop. The time constant of this feedback circuit is effectively the same as the heating and cooling time constant of the Nitinol wire 70. The dynamic system gain, i.e., the response to sudden changes, is relatively low, but the static gain is very high, so as to assure high positioning-accuracy.

The slide wire 224 is supplied with a d-c voltage (8.125 volts) from an integrated circuit voltage regulator 262 of conventional design. This supply voltage also energizes a voltage-dividing circuit including resistors 264, 266 (1.47K; 6.19K) and resistor 210. Resistor 210 provides a bias signal which causes the position of the slide-wire to be a short distance (e.g., 5% of travel) from the end of its stroke when the command signal is zero. This avoids any problems with non-linearity which might arise near the end of the slide-wire stroke.

The junction between resistors 264, 266 is connected through an isolating diode 268 to the base of a transistor 270. If the voltage at the wiper of the slide-wire 224 exceeds a predetermined value (indicating that the output lever 76 has reached a pre-set limit position for contraction of the wire 70), a transistor 270 conducts so as to shunt resistor 226. This serves, in effect to increase the voltage applied to amplifier feedback terminal 222, thereby tending to rebalance the amplifier input. Thus, when the command signal demands a pen position beyond the prescribed limit, and the slide-wire reaches that limit, this circuit automatically produces what is in effect an artificial amplifier input signal which indicates that the pen has reached the commanded position, even though in fact the pen has not actually gone beyond the pre-set limit position. Accordingly, the limiter circuit prevents the wire 70 from being driven beyond the motion allowable for lever 76.

Although specific embodiments of the invention have been described herein in detail, it is desired to stress that this is for the purpose of illustrating the invention, and should not be considered as necessarily limiting of the invention, since it is recognized that various modifications of the apparatus can be made by those skilled in the art to suit particular applications, without departing from the scope and spirit of the invention.

We claim:
1. Positioning apparatus comprising: an elongate element formed of electrically conductive material which changes length with changes in temperature;
   support means providing two spaced element-receiving means;
   said support means including a motion member to be moved in response to the changes in length of said element;
   means securing respective spaced portions of said elongate element directly to said element-receiving means free of electrical insulating material, said support means providing an electrically conductive path which in cooperation with said electrically conductive element establishes a closed loop adapted to carry electrical current; and
   winding means inductively coupled to said closed loop to develop an alternating magnetic field passing through said closed loop, said winding means and said closed loop together forming a transformer with said winding means serving as the transformer primary winding and said closed loop serving as a single-turn transformer secondary winding;
   the electrical voltage induced in said single-turn closed-loop secondary winding by said alternating magnetic field being effective to develop current therein of controllable magnitude, so as to control the temperature of the section of said elongate element between said spaced portions.

2. Apparatus as claimed in claim 1, wherein said primary is wound on a toroid; said element comprising a wire portion passing through the center of said toroid and said electrically-conductive support means path completing said closed loop around the outside of said toroid.

3. Apparatus as claimed in claim 1, including oscillator means coupled to said primary to supply alternating-current pulses thereto.

4. Apparatus as claimed in claim 1, including a second winding coupled to said primary winding; said two windings forming part of the oscillator circuit.

5. Apparatus as claimed in claim 1, wherein said element is a wire formed of an alloy which exhibits a martensitic transformation creating a change in length in response to changes in temperature

* * * * *